US00RE42619E

(19) United States
(12) Reissued Patent
Dieny et al.

(10) Patent Number: US RE42,619 E
(45) Date of Reissued Patent: Aug. 16, 2011

(54) MAGNETIC TUNNEL JUNCTION MAGNETIC DEVICE, MEMORY AND WRITING AND READING METHODS USING SAID DEVICE

(75) Inventors: Bernard Dieny, Lans en Vercors (FR); Olivier Redon, Seyssinet Pariset (FR)

(73) Assignee: Commissariat a l'Energie Atomique, Paris (FR)

(21) Appl. No.: 11/861,974

(22) PCT Filed: Nov. 14, 2002

(86) PCT No.: PCT/FR02/03896

§ 371 (c)(1),
(2), (4) Date: May 13, 2004

(87) PCT Pub. No.: WO03/043017

PCT Pub. Date: May 22, 2003

Related U.S. Patent Documents

Reissue of:
(64) Patent No.: 6,950,335
Issued: Sep. 27, 2005
Appl. No.: 10/495,637
Filed: May 13, 2004

(30) Foreign Application Priority Data

Nov. 16, 2001 (FR) ..... 01 14840

(51) Int. Cl.
*G11C 11/14* (2006.01)

(52) U.S. Cl. ..... 365/171; 365/97; 365/158; 365/173

(58) Field of Classification Search ..... 365/158, 365/171, 173, 97
See application file for complete search history.

(56) References Cited

U.S. PATENT DOCUMENTS

| | | | | |
|---|---|---|---|---|
| 5,640,343 | A | 6/1997 | Gallagher et al. | |
| 6,272,036 | B1 | 8/2001 | You et al. | |
| 6,347,049 | B1 * | 2/2002 | Childress et al. | 365/173 |
| 6,351,410 | B1 * | 2/2002 | Nakao et al. | 365/171 |

(Continued)

FOREIGN PATENT DOCUMENTS

JP 2003060173 A 2/2003

(Continued)

OTHER PUBLICATIONS

Parkin et al., "Exchange-biased magnetic tunnel junctions and application to nonvolatile magnetic random access memory (invited)", Apr. 15, 1999, Journal of Applied Physics, vol. 85, No. 8, pp. 5828-5833.

*Primary Examiner* — Pho M Luu
(74) *Attorney, Agent, or Firm* — Brinks Hofer Gilson & Lione

(57) ABSTRACT

Magnetic tunnel junction magnetic device [(16)] for writing and reading uses a reference layer [(20c)] and a storage layer [(20a)] separated by a semiconductor or insulating layer [(20b)], *which can include an antiferromagnetic layer adjacent the storage layer*. The blocking temperature of the [magnetisation] *magnetization* of the storage layer is less than that of the reference layer. The storage layer is heated [(22, 24)] above the blocking temperature of its [magnetisation] *magnetization*. A magnetic field [(34)] *or a magnetic torque created by the injection of spin polarized electrons* is applied [(26)] to it orientating its magnetization with respect to that of the reference layer without modifying the orientation of the reference layer.

40 Claims, 7 Drawing Sheets

U.S. PATENT DOCUMENTS 6,376,260 B1 * 4/2002 Chen et al. ..... 438/3
6,385,082 B1 5/2002 Abraham et al.
6,473,337 B1 * 10/2002 Tran et al. ..... 365/173
6,532,164 B2 3/2003 Redon et al.
6,552,928 B1 * 4/2003 Qi et al. ..... 365/171
6,574,079 B2 * 6/2003 Sun et al. ..... 360/324.2
6,603,677 B2 8/2003 Redon et al.
2001/0019461 A1 9/2001 Allenspach et al.

FOREIGN PATENT DOCUMENTS

WO WO 00/79540 12/2000

* cited by examiner

FIG. 4
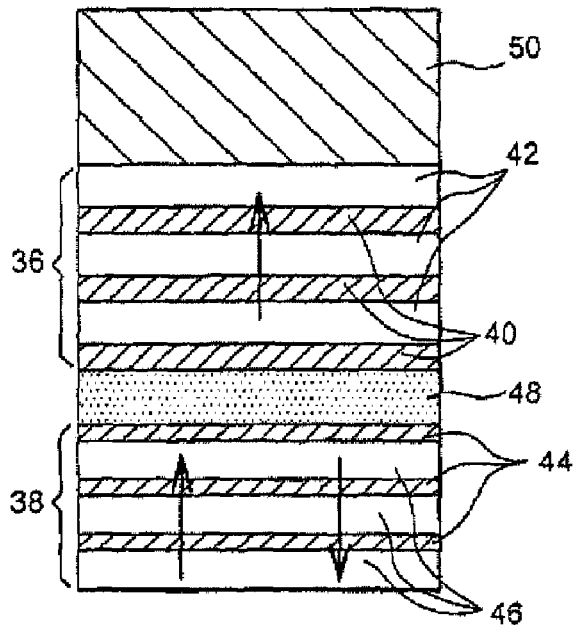
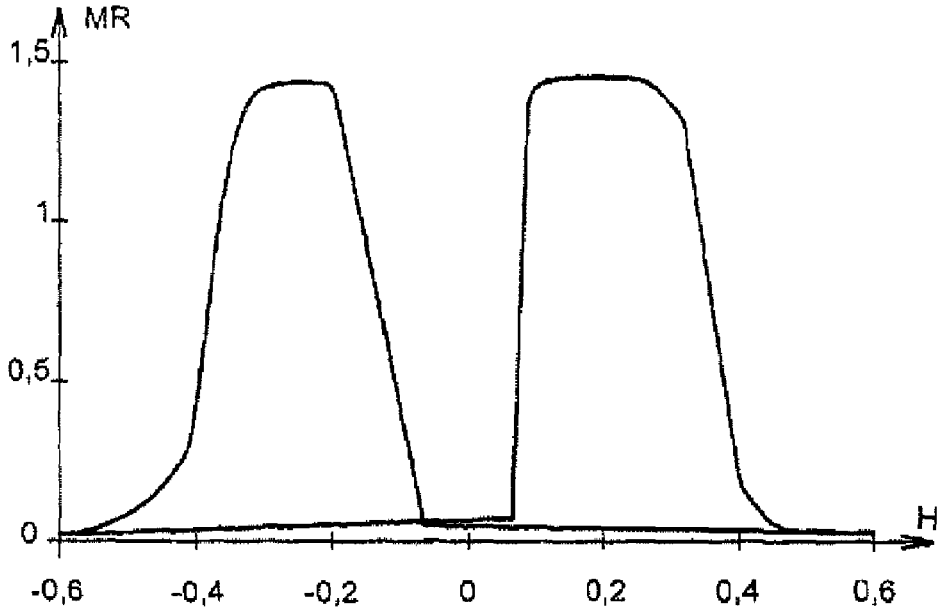
FIG. 5

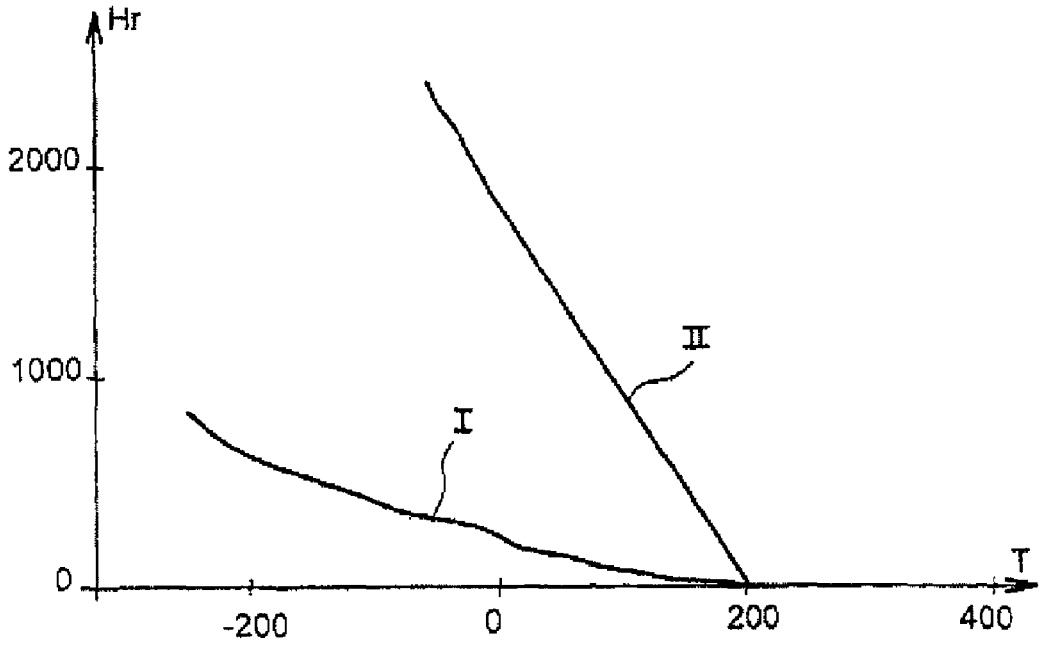
FIG. 6
FIG. 9
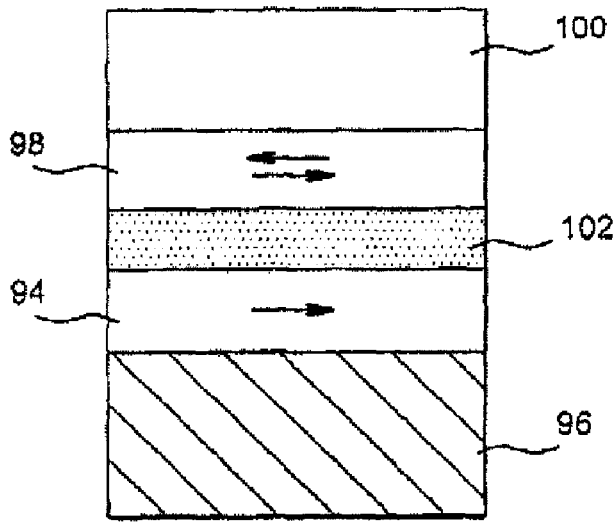

MAGNETIC TUNNEL JUNCTION MAGNETIC DEVICE, MEMORY AND WRITING AND READING METHODS USING SAID DEVICE

Matter enclosed in heavy brackets [ ] appears in the original patent but forms no part of this reissue specification; matter printed in italics indicates the additions made by reissue.

*This is a reissue application of U.S. application Ser. No. 10/495,637, now U.S. Pat. No. 6,950,335.*

CROSS-REFERENCE TO RELATED APPLICATION

This application claims priority based on International Patent Application No. PCT/FR02/03896, entitled "Magnetic Device with Magnetic Tunnel Junction, Memory Array and Read/Write Methods Using Same" by Bernard Dieny and Olivier Redon, which claims priority of French Application No. 01 14840, filed on Nov. 16, 2001, and which was not published in English.

TECHNICAL FIELD

The present invention concerns a magnetic tunnel junction device and a memory using said device.

The invention further concerns a thermomagnetic writing method in said device and a reading method of said device.

The invention finds an application in electronics and, in particular, in the formation of storage elements and MRAM (Magnetic Random Access Memory) type memories or direct (or random) access magnetic memory.

STATE OF THE PRIOR ART

There has been renewed interest in MRAM magnetic memories with the development of MTJ (magnetic tunnel junctions) that have high magnetoresistance at ambient temperature.

With regard to magnetic memories using magnetic tunnel junctions, one should refer, for example, to the following documents:

(1) U.S. Pat. No. 5,640,343 A (Gallagher et al.)

(2) S. S. P. Parking et al., J. Appl. Phys., vol. 85, no 8, 1999, pp. 5828-5833.

Appended FIGS. 1A and 1B schematically illustrate the structure and the function of a known magnetic tunnel junction.

The junction bears the reference 2. It is a stack comprising an oxide layer 3b sandwiched between two magnetic layers. This system functions like a spin gate, with the difference that the current flows perpendicularly to the planes of the layers.

One 3a of the magnetic layers is called "free" or "storage" since one can orient its magnetisation in the desired direction by means of an external magnetic field (two directional arrow); the other magnetic layer 3c is called "pinned" or "reference" since its magnetisation direction is fixed by exchange coupling with an antiferromagnetic layer (single directional arrow).

When the magnetisations of the magnetic layers are antiparallel, the resistance of the junction is high; when the magnetisations are parallel, said resistance becomes low. The relative variation of resistance between these two states can attain 40% through an appropriate choice of materials for the layers in the slack and/or thermal treatments of said materials.

The junction 2 is placed between a switching transistor 4 and a current supply line 6 forming an upper conductive line. A current I1 flowing in said line produces a first magnetic field 7. A conductor 8 forming a lower conductive line, orthogonal to the current supply line 6 enables, by making a current I2 flow in said line, a second magnetic field 9 to be produced.

In the "writing" mode (FIG. 1A), the transistor 4 is placed in blocked mode and therefore no current passes through this transistor. One circulates current impulses in the current supply line 6 and in the conductor 8. The junction 2 is therefore subjected to two orthogonal magnetic fields. One is applied along the axis of difficult magnetisation of the free layer 3a, in order to reduce its reversal field, whereas the other is applied along its easy axis in order to provoke the reversal of the magnetisation and thus the writing of the storage element.

In principle, only the storage element placed at the intersection of the two lines 6 and 8 is capable of reversing itself, since each magnetic field taken individually is not sufficiently strong to provoke a switch over of the magnetisation.

In the "reading" mode (FIG. 1B, the transistor is place in saturated regime (in other words, the current crossing this transistor is maximum) by sending a positive current impulse in the gate of the transistor. The current 13 sent in the line 6 only crosses the storage element in which the transistor is placed in saturated mode.

This current makes it possible to measure the resistance of the junction of this storage element. In relation to a reference storage element, the state of the storage element ("0" or "1") may thus be determined: one then knows if the magnetisation of the storage layer 3a is parallel or antiparallel to that of the reference layer 3c.

This type of writing mechanism has disadvantages, in particular, in a tunnel junction array:

1) Since the reversal of the magnetisation of the free layer of a junction is produced under the effect of exterior fields an since the reversal fields are statistically distributed, it is not impossible to accidentally reverse certain neighbouring junctions simply by the effect of the magnetic field produced along a lower or upper conductive line. Since, for high density memories, the size of the storage elements is distinctly submicronic, the number of addressing errors increases.

2) The reduction in the size of the storage elements leads to an increase in the value of the individual reversal field; a higher current is then necessary to write the storage elements, which tends to increase the electricity consumption.

3) The writing mode uses two current lines at 90°, which limits the integration density.

DESCRIPTION OF THE INVENTION

The aim of the present invention is to overcome the above-mentioned disadvantages.

According to one aspect of the present invention, one proposes a magnetic tunnel junction magnetic device that may be used in a MRAM and in which the writing mechanism is insensitive to the distribution of the reversal fields in order to eliminate the addressing errors and to obtain good reproducibility in the writing of information.

According to another aspect of the invention, one proposes a magnetic tunnel junction magnetic device in which the energy consumption is low.

According to another aspect, one proposes a magnetic tunnel junction magnetic device that enables a multi-level storage of information. This has the advantage, in a memory according to the invention, of increasing the storage capacity for a same number of storage elements.

A further aim of the present invention is to improve magnetic memories by reducing the size of their storage elements, while at the same time keeping the information stable at ambient temperature, as well as the level of writing errors of said memories.

In the invention, one uses a known property of a magnetic material, according to which the reversal field of the magnetisation is very low when one increases the temperature of said material beyond the blocking temperature of the magnetisation of said material.

More precisely, the present invention concerns a magnetic device comprising a magnetic tunnel junction that comprises:

a first magnetic layer forming a reference layer and having a magnetisation of fixed direction, a second magnetic layer forming a storage layer and having a magnetisation of variable direction, and a third layer that is semiconductive or electrically insulating and which separates the first layer from the second layer, said device being characterised in that the blocking temperature of the magnetisation of the storage layer is lower than the blocking temperature of the magnetisation of the reference layer and in that the device further comprises:

means for heating the storage layer to a temperature higher than the blocking temperature of the magnetisation of said storage layer, said means of heating the storage layer being means provided to make an electric current flow through the magnetic tunnel junction, and means for applying, to said storage layer, a magnetic field capable of orientating the magnetisation of said storage layer in relation to the magnetisation of the reference layer, without modifying the orientation of said reference layer.

According to a preferred embodiment of the invention, the blocking temperatures of the storage and reference layers have values greater than the value of the operating temperature of the device outside of heating of the tunnel junction (one knows that the device heats up when it operates).

According to a first specific embodiment of the device of the invention, the magnetisation of each of the storage and reference layers is substantially perpendicular to the plane of said layers.

In this case, the storage layer may be a mono-layer in Co—Pt or Co—Pd alloy or a multi-layer formed by a stack of Co layers alternating with layers of Pt or Pd in such a way that the coercive field of the storage layer rapidly decreases when the temperature increases.

As a variant, the storage layer may be a mono-layer in cobalt rich alloy with iron or nickel or chromium and platinum or palladium, or a multi-layer formed by a stack of layers of an alloy rich in cobalt with iron or nickel or chromium, alternating with layers of Pt or Pd in such a way that the coercive field of the storage layer rapidly decreases when the temperature increases.

According to a second specific embodiment, the magnetisation of each of the storage and reference layers is substantially parallel to the plane of said layers.

The device of the invention may further comprise a first antiferromagnetic layer combined with the reference layer.

Preferably, the blocking temperature of the magnetisation of said first antiferromagnetic layer is higher than the blocking temperature of the storage layer.

According to a specific embodiment of the invention, the reference layer is a multi-layer comprising two magnetic layers and an intermediate layer in Ru or Re or Ir or Rh, the two magnetic layers being separated by the intermediate layer and coupled in an antiparallel manner by interaction through said intermediate layer.

According to a preferred embodiment of the device of the invention, said device further comprises a second antiferromagnetic layer coupled to the storage layer by exchange anisotropy.

Preferably, the blocking temperature of the magnetisation of said second antiferromagnetic layer is lower than the blocking temperature of the reference layer.

The means of applying the magnetic [field] *torque* to the *magnetization of the* storage layer may comprise means of injecting, in said storage layer, a current of electrons in which the spin is polarised.

The present invention also concerns a memory comprising a matrix of storage elements that are addressable by addressing lines and columns, said memory being characterised in that each storage element comprises:

a magnetic device according to the invention, and a means of current switching placed in series with said magnetic device, each magnetic device being linked to an addressing line and each means of switching being linked to an addressing column.

The present invention also concerns a method for writing information in a magnetic device according to the invention, in which:

one heats the storage layer to a temperature higher than the blocking temperature of the magnetisation of said storage layer, and during the cooling of the storage layer, one applies to said storage layer a magnetic field capable of orientating the magnetisation of said storage layer in relation to the magnetisation of the reference layer, without modifying the orientation of said reference layer.

Preferably, the value, seen by the reference layer, of the magnetic field applied during the storage, is less than the value that the reversal magnetic field of the magnetisation of the reference layer reaches at the maximum temperature attained by said layer during the heating of the junction.

According to a preferred embodiment of the writing method of the invention, the storage layer is coupled to an antiferromagnetic layer by exchange anisotropy and one heats the storage layer and said antiferromagnetic layer to a temperature higher than the blocking temperatures of the magnetisation of said layers and, during the cooling of the antiferromagnetic layer, one orientates the magnetisation of the storage layer in any direction whatsoever predefined by the direction of magnetisation of the magnetic field applied during the cooling, The present invention further concerns a method for reading information memorised in a device according to the invention, in which one determines the resistance value of the magnetic tunnel junction, and one deduces the orientation of the magnetisation of the storage layer from said resistance value.

BRIEF DESCRIPTION OF DRAWINGS

The present invention will be more fully understood on reading the description of embodiments that follows, given by way of illustration and in nowise limitative, and by referring to the appended drawings, in which:

FIG. 4 is a schematic cross sectional view of a tunnel junction that may be used in the present invention and in which the layers have a magnetisation perpendicular to the plane of said layers, FIG. 5 is a graph illustrating the formation of two different coercive fields by coupling to an antiferromagnetic material one of the two layers of a tunnel junction that may be used in the invention, FIG. 6 is a graph showing the variations in the reversal field as a function of the temperature for multi-layers that may be used in the invention, FIG. 7 schematically illustrates an example of a series of magnetic devices according to the invention, using tunnel junctions with magnetisation perpendicular to the plane of their layers, FIG. 8 schematically illustrates an example of magnetic device according to the invention, using the combination of heating by Joule effect and magnetic switching by injection of a current of electrons in which the spin is polarised, FIG. 9 is a schematic cross sectional view of an example of tunnel junction that may be used in the invention and has a planar magnetisation.

DETAILED DESCRIPTION OF SPECIFIC EMBODIMENTS

Figure 1A:
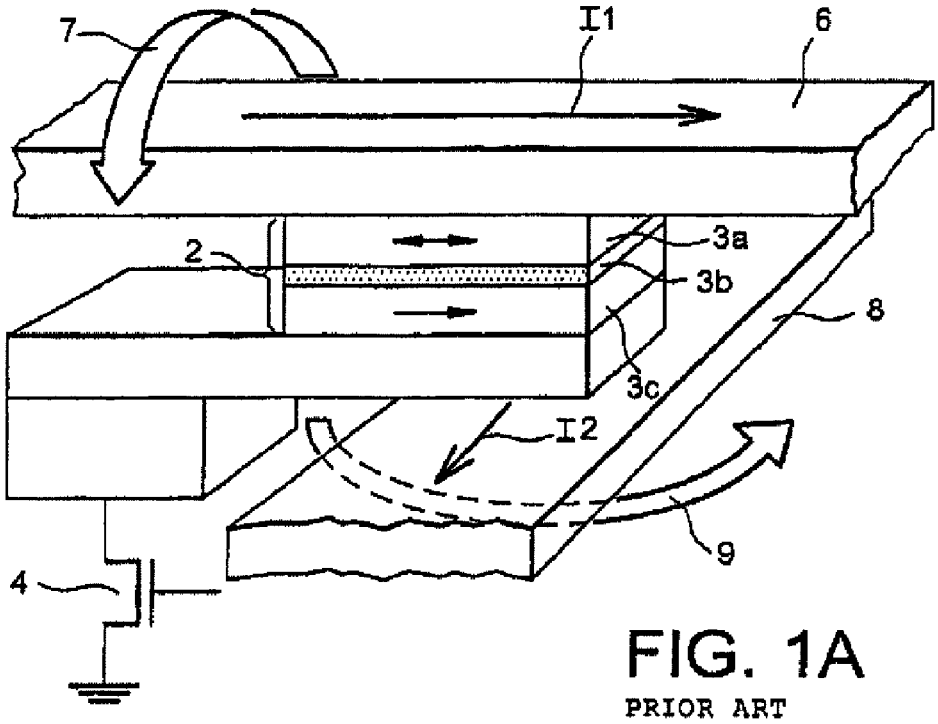
FIG. 1A PRIOR ART
FIGS. 1A and 1B schematically illustrate the operating principle of a known magnetic tunnel junction device, and have already been described.
Figure 1B:
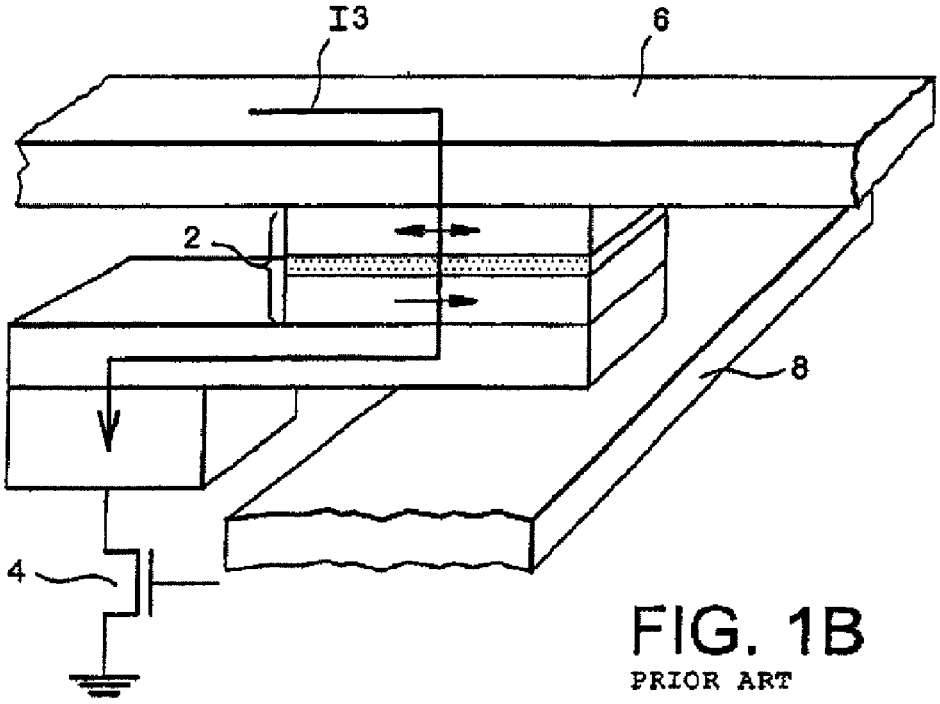
FIG. 1B PRIOR ART

In an example of the present invention, a magnetic memory comprises a matrix of magnetic devices according to the invention. Each of said devices, also called "storage elements", comprises a magnetic tunnel junction of the form F1/O/F2 where F1 and F2 respectively designate the magnetic storage layer, also called the "storage magnetic electrode", and the magnetic reference layer, also called "reference magnetic electrode", and O designates the layer that is comprised between F1 and F2 and forms a tunnel barrier.

Each of the layers F1 and F2 is characterised by a reversal field of its magnetisation, said field being a function of the temperature of the material forming this layer.

In the present invention, the materials of layers F1 and F2 are chosen in such a way that the reduction in temperature of the reversal field of layer F1, designated HcF1, is a lot quicker than that of the reversal field of layer F2, designated HcF2.

Typically, one chooses the materials for layers F1 and F2 in such a way that their reversal fields are, at ambient temperature (around 20° C.), around 100 Oe (around 8000 A/m) for F1 (it is recalled that 1 Oe equals 1000/(4π) A/m) and around 600 Oe (around 48000 A/m) for F2 and, at 200° C., around 5 Oe (around 400 A/m) for F1 and 400 Oe (around 32000 A/m) for F2.

In other words, one chooses the materials for layers F1 and F2 in such a way that the blocking temperature of the magnetisation of layer F1, also called "magnetic blocking temperature" of layer F1 or, more simply, "blocking temperature" of layer F1, is significantly lower than the blocking temperature of the magnetisation of layer F2.

During the writing, the principle of the selection of a storage element then consists in provoking a very brief heating (up to a temperature Tmax, typically up to 200° C.) of said storage element, said heating having the effect of lowering the reversal field of the magnetisation of the magnetic layer F1 in which the information is stored.

Since the operating principle of the device is based on temperature variations, it appears obvious that the storage and reference layers must preferably have blocking temperatures higher than the operating temperature of the device outside of heating.

Moreover, since the aim of this device is to store information in a stable manner, it is therefore, for this reason, preferable that said layers have blocking temperatures significantly higher than the operating temperature of the device.

During the cooling of the storage element, a magnetic field of amplitude He such that $$HcF1(Tmax)<He<HcF2(Tmax)$$

He this being typically between around 20 Oe and 60 Oe (around 1600 A/m and 4800 A/m), is applied in the direction in which one wishes to orientate the magnetisation of the storage layer F1.

The magnetisation of said storage layer F1 than orientates itself in the direction of the applied field He whereas that of the reference layer F2, also called "pinned layer", always remains orientated in the same direction.

The heating of the junction may be controlled by sending a short current impulse (around $10^5$ A/cm$^2$ to $10^6$ A/cm$^2$ for a few nanoseconds) through the junction.

The magnetic field He is created by sending current impulses in the conductive lines situated in the planes lying above and/or below the magnetic tunnel junctions.

A second possibility of provoking the switching of the magnetisation of the storage layer during its cooling may consist in injecting in said layer a current of electrons in which the spin is polarised, according to one of the techniques detailed hereafter.

The present invention consists in this case in combining the heating of the material of the storage layer, in order to reduce the reversal field of the magnetisation of said layer, with the application of a magnetic torque to this magnetisation, during the cooling of the storage layer, by flowing a current of electrons in which the spin is polarised through the storage layer.

It is also possible to combine the switching, through application of a local field generated by sending a current in an upper or lower conductive line, with the injection of a current of electrons with polarised spin in the storage layer of the junction.

Figure 2:
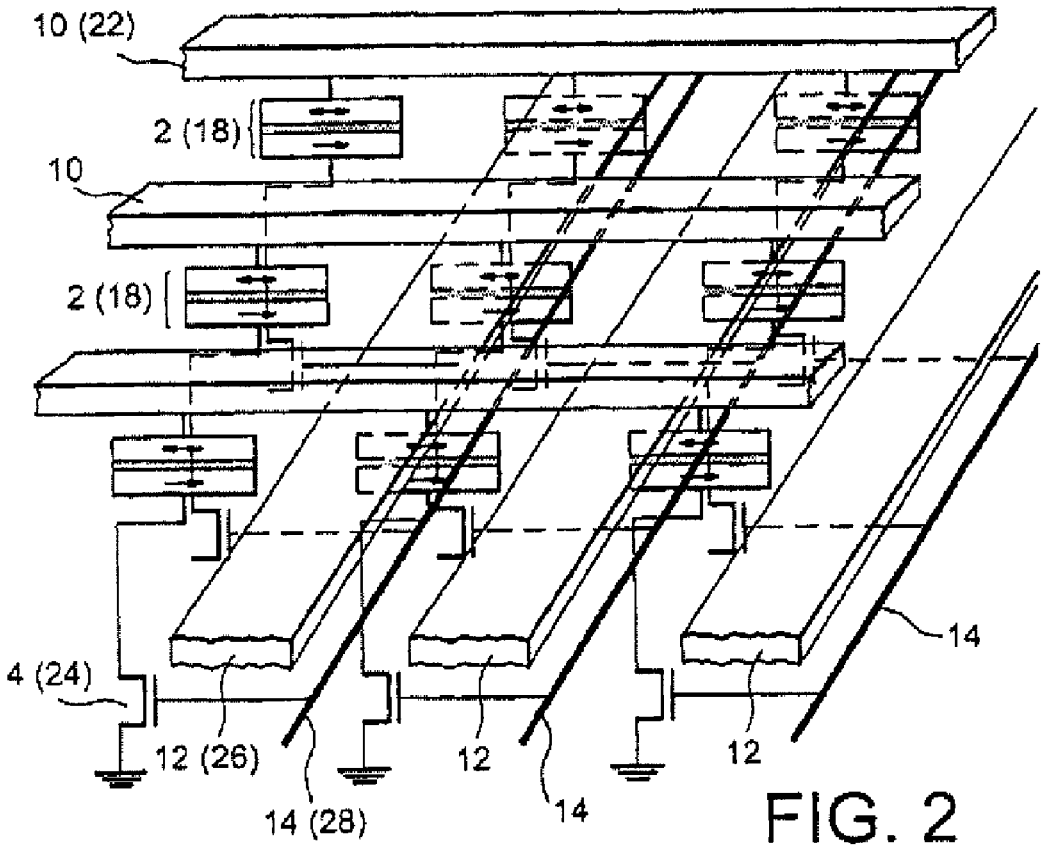
FIG. 2 is a schematic and partial view of a memory comprising a matrix of magnetic tunnel junction devices, FIG. 3 schematically illustrates the operating principle of a magnetic tunnel junction device according to the invention.

Four major advantages of the present invention may be highlighted:

1) Flawless Selection of Storage Elements:

The present invention enables much better selection of storage elements than known technologies. Indeed, let us assume that the storage elements are organised into a square array as seen in FIG. 2, which represents the architecture of a known MRAM.

In said known memory, one distinguishes three levels of lines:

upper conductive lines 10 that serve to generate the magnetic field Hx to apply to the magnetic tunnel junctions 2 during the writing and that also serve as electrical contacts for said junctions during the reading, lower conductive lines 12 that only serve to generate the magnetic field Hy at the moment of the writing, and control lines 14 that act on the transistor gates 4 to put them into the passing position (saturated) or closed position (blocked).

According to a known writing procedure, the writing is carried out by sending current impulses along the upper and lower conductive lines, which cross at the storage element that one wishes to address. However, if there [if] *is* a distribution of reversal field, certain storage elements situated along the lines risk reversing in an uncontrolled manner.

In the present invention, this problem is not posed. This is schematically illustrated by FIG. 3, which shows a magnetic device 16 according to the invention, forming a storage element, or cell, of a MRAM memory according to the invention.

Said storage element comprises a magnetic tunnel junction 18, comprising a storage layer 20a, a reference layer 20c and an insulating or semiconduetive layer 20b between these layers. This junction is placed between an upper conductive line 22 and a switching transistor 24 and combined with a lower conductive line 26 that is perpendicular to the line 22.

By turning the transistor 24 of the storage element 16 to the passing state, said transistor being commanded by a control line 28, and by sending a current impulse 30 in the corresponding upper conductive line 22, said current impulse crosses the junction 18 and provokes its heating.

Figure 3:
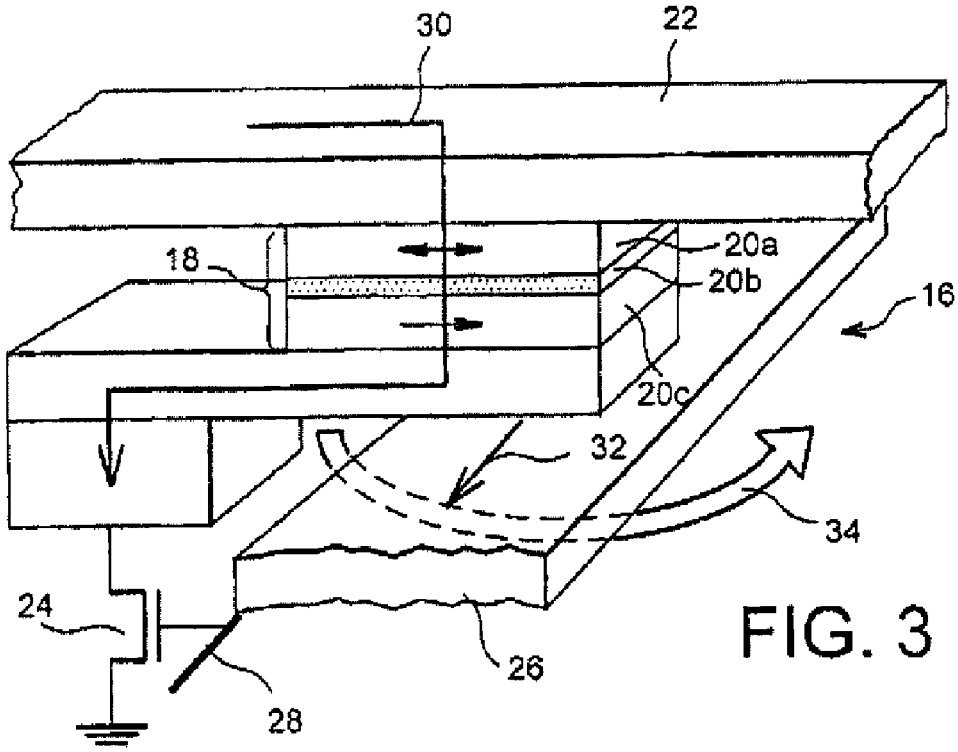

However, the junctions of the memory of FIG. 3 are organised in a square array as in the memory in FIG. 2 (in which the references of the elements are moreover followed, in brackets, by references of the corresponding elements of FIG. 3). Consequently, only one junction of the whole array will be heated by the current impulse 30, all of the others remaining at ambient temperature.

The lowering of the reversal field linked to the temperature rise (typically from 100 Oe, at 20° C., to 5 Oe, at 200° C.) is a much more significant than the distribution width of the reversal field at ambient temperature (typically 100 Oe±20 Oe).

Consequently, by sending a current impulse 32 in the lower conductive line 26, which generates a magnetic field 34 of around 10 Oe during the cooling of the addressed junction, one is sure to only switch the magnetisation of the storage layer 20a of said junction.

However, the line 26 is not indispensable for creating the magnetic field. One could quite easily use the upper line 22 (used in a first phase to provoke the heating) to generate, in a second phase, the magnetic field during the cooling.

In the case of FIG. 3, if one eliminates the line 26, it is necessary to make sure that the directions of magnetisation of the layers is perpendicular to the current line 22 generating the magnetic field (for example[, by making the device pivot] *by orienting the magnetization of the reference layer 20c perpendicular to line 22 and setting axis of magnetization of the layer 20a perpendicular to line 22*).

The operation of the storage element 16 of FIG. 3 is therefore as follows: since the addressing transistor 24 is in the passing state, the writing is achieved by sending a current impulse through the junction 18 to heat the junction up to around 200° C. During the cooling of the junction, a current impulse is sent in the lower conductive line 26 to generate a magnetic field in the storage layer 20a, which has the effect of switching the magnetisation of said layer in the desired direction.

The reading is achieved with the transistor in the passing state by making a current flow through the junction (the current being lower than during the writing so that the heating is less), which makes it possible to measure the resistance and thus to know if the magnetisation of the storage layer 20a is parallel or antiparallel to that of the reference layer 20c.

2) Reduced Consumption:

Given the fact that the fields to be generated for the writing are a lot weaker than in the prior an (typically 10 Oe in the present invention compared to 50 Oe in the prior art), the intensity of the field impulses to send in the conductive lines is considerably reduced.

Moreover, a single impulse in the lower conductive line is necessary in the case of FIG. 3, compared to one impulse in the lower conductive line and one impulse in the upper conductive line in the prior art.

Since the power required to provoke the heating of the storage element is a lot less than to generate field impulses of 50 Oe (typically 1 pJ to heat a magnetic tunnel junction of 150 nm×150 nm to 200° C. compared to several tens of pJ to generate a field impulse of 50 Oe along a line of 500 storage elements), it follows that the electrical consumption may be divided by 10 with the operating principle of the present invention.

3) Stability of Information for Small Dimensions:

The present invention makes it possible to use, for the storage layer, materials with high pinning energy at ambient temperature. In the prior art, this is not possible since the higher the pinning of the storage layer, the more it is necessary to supply energy to switch the magnetisation of the storage layer.

In the present invention, one lowers the pinning energy during the writing by heating the material. One may thus make it possible to have a high pinning energy at ambient temperature. This presents a considerable advantage for small dimensions. Indeed, in the prior art, the information stored in the storage layer becomes unstable in relation to the thermal fluctuations at ambient temperature.

Indeed, if K and V respectively designate the magnetic anisotropy per unit of volume (or, more generally, the pinning energy per unit of volume) and the volume of the storage layer, the information becomes unstable if $KV<25\ kT$ (where k is the Boltzmann constant and T the temperature).

For a given material, this limit is always reached at one moment or another when one reduces the size of the storage element whereas, in the present invention, one can very easily compensate the reduction in the volume by an increase in the pinning energy at ambient temperature and thus reduce the size of the storage element as far as the manufacturing method used (for example, lithography/engraving) allows.

4) Simplicity of production if one uses as switching principle a heating plus an injection of a current of electrons with polarised spin:

Indeed, there is no need, in this case, to add a level of lines for the generation of local magnetic fields. The production of a series of storage elements is simplified, which makes it possible to attain higher integration densities.

We will return later to the use, in the present invention, of a current of electrons with polarised spin.

We will now consider, in the following description, various examples of the invention.

As we have seen above, the basic structure, in the present invention, comprises two magnetic layers F1 and F2 separated by a tunnel barrier O in such a way that one may designate this structure F1/O/F2. The two magnetic layers are such that the reversal field of the magnetisation of one of these two magnetic layers (the storage layer) decreases much more quickly, when the temperature increases, than that of the other magnetic layer (the reference layer).

In a first embodiment of the invention, the magnetisations of the two layers F1 and F2 are perpendicular to the plane of the layers or, more precisely, to the interfaces of said layers.

Layers F1 and F2 may comprise a pure material, an alloy or a series of alternating layers, certain of which are magnetic.

Co layers, of hexagonal structure, have their magnetisation perpendicular to the plane of these layers if the axis c of the hexagonal lattice is perpendicular to the plane of the sample containing said layers. Alloy layers such as CoPt, FePd and FePt may also have magnetisations perpendicular to their planes. Finally, multi-layers comprising alternating layers of two different materials at least one of which is magnetic, such as for example Co 0.6 nm/Pt 1.4 nm, may also have magnetisations perpendicular to the plane.

The cobalt may easily be replaced by an alloy rich in Co (greater than 70%) with for example Fe or Ni or Cr.

An example of forming a multi-layer Co/Pt based magnetic tunnel junction, which may be used in the present invention, is shown in FIG. 4.

More precisely, as can be seen in FIG. 4, said magnetic tunnel junction comprises a reference layer 36 and a storage layer 38 that have a magnetisation perpendicular to the plane of said layers; the reference layer 36 comprises layers 40 in cobalt that alternate with layers 42 in platinum; similarly, the storage layer 38 comprises layers 44 in cobalt that alternate with layers 46 in platinum; the layers 36 and 38 are separated by a tunnel barrier layer 48 in alumina.

By playing on the relative thicknesses of Co and Pt, one can vary the coerciveness of the material making up each of the layers 36 and 38 as well as the variation of said coerciveness as a function of the temperature. One can also increase the blocking energy of the magnetisation of one of the layers (the reference layer 36) by coupling iL to an antiferromagnetic material 50 with high blocking temperature, such as PtMn or PtPdMn.

In this case, the adjacent ferromagnetic layer sees the value of its blocking temperature increase up to the value of that of the antiferromagnetic layer.

Other examples of perpendicular anisotropy multi-layers, which may be used in the invention, are for example Co/Pd, Co/Ni and Cu/Ni.

By way of example, FIG. 5 shows that one may obtain a structure with magnetisation perpendicular to the plane, which combines two multi-layers with different coerciveness.

We have plotted the variations in the magnetoresistance MR (in %) as a function of the applied magnetic field H (in kOe) for the structure.

$$[NiO_{300}/Co_6/(Pt_{18}/CO_6)_2/Cu_{30}/(CO_6/Pt_{18})_2]$$

$$NiO_{30nm}/Co_{0.6nm}/(Pt_{1.8nm}/Co_{0.6nm})_2/Cu_{3nm}/(Co_{0.6nm}/Pt_{1.8nm})_2.$$

In the case of FIG. 5, the increase in the coerciveness of one of the multi-layers is obtained by coupling the magnetisation of said multi-layer to an adjacent antiferromagnetic layer (for example, NiO (case of FIG. 5), PtMn, PdPtMn or FeMn).

The same result may be obtained by combining a multi-layer of Co/Pt to an alloy of FePt.

Moreover, each of the abovementioned materials has its own variation of coercive field as a function of the temperature.

FIG. 6 shows, for example, the variations in the Hr reversal field (in Oe) of a multi-layer (Co 0.6 nm/Pt 1.4 nm) as a function of the temperature T (in ° C.) for a "full wafer" wafer, of macroscopic lateral dimension (curve I), and in arrays of pads of submicronic dimensions (curve II).

With the thicknesses of Co and Pt used, the Hr reversal field decreases rapidly with the temperature and virtually cancels itself out at a temperature Tc of around 200° C.

If one increases the thickness of Co at fixed Pt thickness, the reversal field decreases less rapidly, in other words cancels out at a temperature greater than 200° C. Similarly, in the alloy FePt, the reversal field cancels out around 500° C.

Therefore, by forming for example a magnetic tunnel junction that combines a multi-layer, formed of alternating layers of Co and layers of Pt, with a FePt alloy electrode, one forms a structure according to the invention. By sending a current impulse through the junction, one raises the temperature of said junction up to around 200° C.

Figure 7:
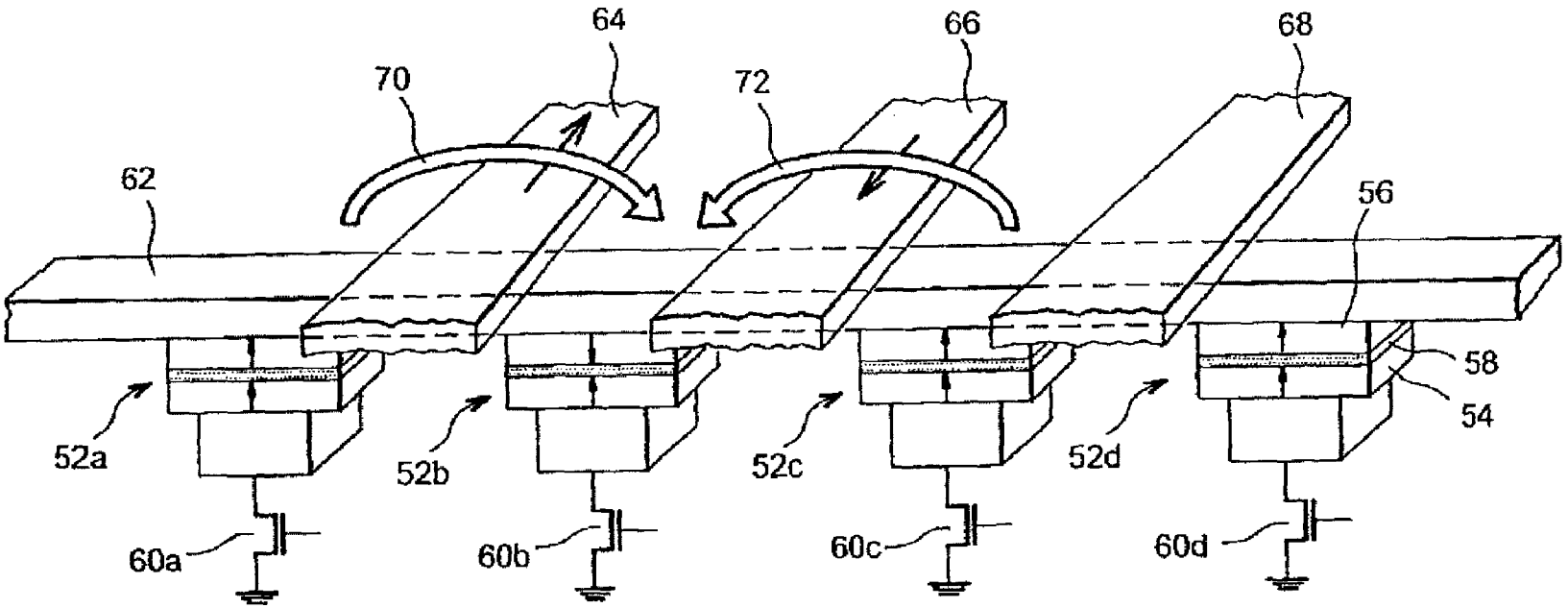

One then cuts the current that is flowing through the junction and, during the cooling of said junction, one applies a weak magnetic field by means of lower or upper conductive lines *64 and 66* (see FIG. 7). The magnetisation of the reference layer remains unchanged whereas that of the storage layer orientates itself in the direction of the applied field during the cooling.

More precisely, FIG. 7 illustrates an example of forming a series of several storage elements from tunnel junctions with magnetisation perpendicular to the plane according to the present invention. Said junctions 52a, 52b, 52c and 52d each comprise a reference layer 54, a storage layer 56 and, between these, an insulating or semiconductive layer 58. Said junctions 52a, 52b, 52c and 52d are placed between the switching transistors 60a, 60b, 60c and 60d and a conductive line 62.

Also shown are upper conductive lines, such as the lines 64, 66 and 68, which are located on either side of the junctions.

For the writing of a storage element, for example that which comprises the junction 52b, said junction is heated above the blocking temperature of the storage layer but below the blocking temperature of the reference layer by sending an impulse through the junction.

Moreover, the transistors are put in the blocked state except for the transistor 60b combined with the junction 52b, which is put in the passing state.

The two upper conductive lines 64 and 66 located on either side of the junction to address 52b are supplied by substantially opposite currents to create two magnetic fields 70 and 72 substantially perpendicular to the plane, which add themselves to the level of the junction to be addressed. Said fields serve to polarise the magnetisation of the storage layer during its cooling below its blocking temperature. The magnetisation of the storage layer may take here two states (binary storage).

A second method for achieving the switching during the cooling consists in injecting a current of electrons with polarised spin through the storage layer. A structure that makes it possible to carry out this operation is shown in FIG. 8.

Figure 8:
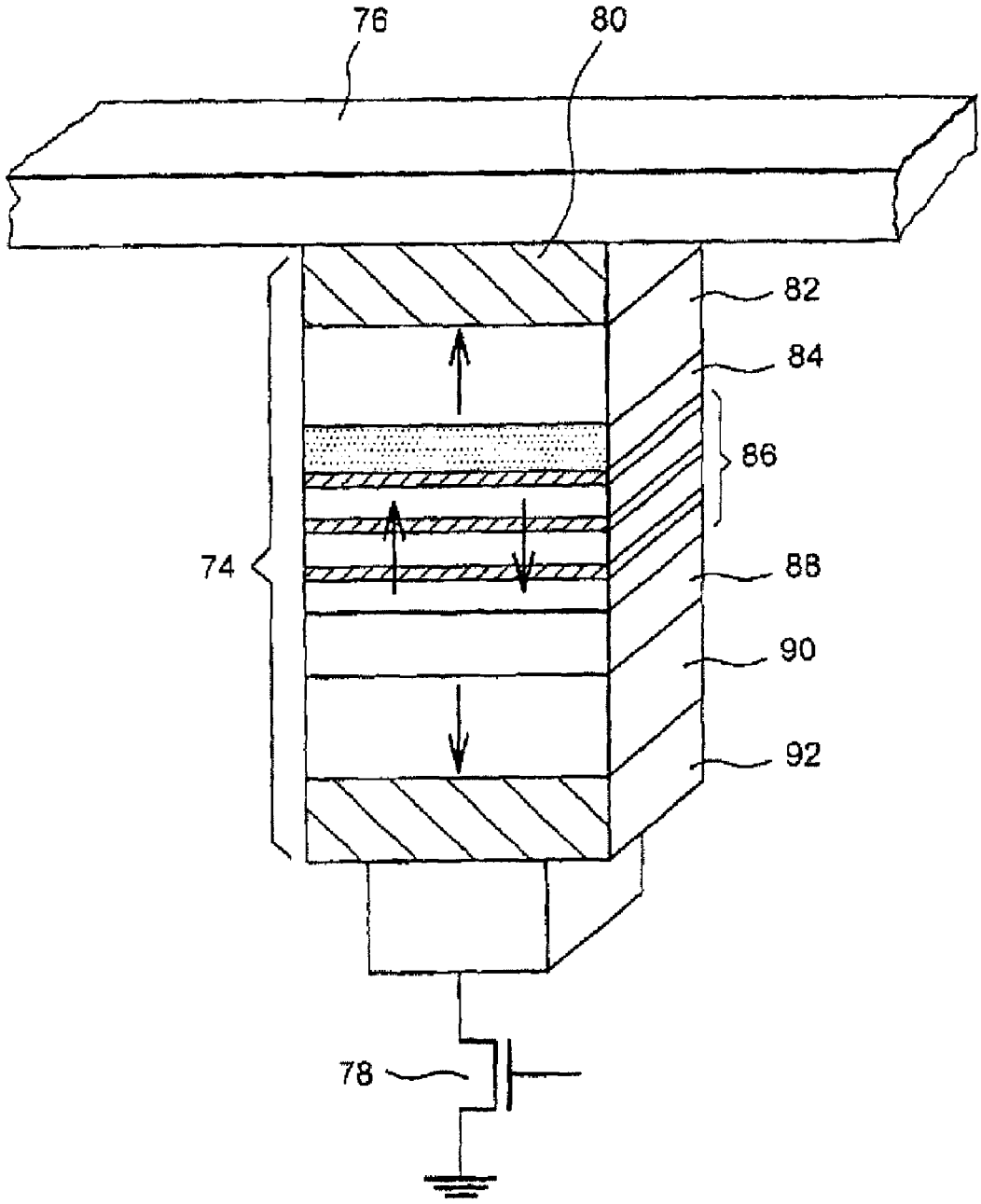

FIG. 8 shows a stack 74 placed between an upper conductive line 76 and a switching transistor 78. The stack comprises, going from the line 76 to the transistor 78, a layer 80 in PtMn, a reference layer 82, an alumina layer 84, a storage layer 86, a copper layer 88, a layer 90 called "polarising" and a layer 92 in PtMn.

The storage layer 86 here comprises a material with perpendicular magnetisation in which the reversal field cancels out around 200° C. such as, for example, a multi-layer (Co/Pt). The reference layer 82 comprises a material in which the reversal field and the magnetisation remain significant at 200° C. such as, for example, FePt. Similarly, the magnetisation of the second magnetic layer of FePt forming the polarising layer 90 remains significant at 200° C.

The principle of magnetic switching is as follows: one applies a current impulse either from the top to the bottom or from the bottom to the top through the tunnel junction.

Said current impulse has a specific profile: it shows its maximum value in a time of around 1 ns to several nanoseconds then drops again progressively to zero in several nanoseconds. Said current impulse has the effect, in a first phase, of heating the junction then, in a second phase, during the decrease of the current, in other words during the cooling of the junction, of orientating the magnetisation in a specific direction.

If the current flows from the top to the bottom (in other words if the electrons flow from the bottom to the top), electrons with spin polarised "towards the bottom" are injected into the multi-layer of Co/Pt. Moreover, the electrons that are going to cross the alumina barrier 84 by tunnel effect are preferentially electrons in which the spin is parallel to the magnetisation of the layer 82 of FePt and are thus electrons with spin "towards the top".

This generates, in the multi-layer of Co/Pt, an excess of electrons towards the bottom. Said excess of electrons towards the bottom, cumulated with the injection of electrons towards the bottom from the lower polarising layer, forces the magnetisation of the multi-layer of Co/Pt to orientate itself towards the bottom during its cooling.

On the other hand, if the current flows from the bottom to the top (in other words, if the electrons flow from the top to the bottom), there is an accumulation of electrons "towards the top" in the layer of Co/Pt, which has the effect of forcing the magnetisation of said layer to orientate itself towards the top during its cooling.

We should point out that this magnetic switching principle could also operate without the lower polarising layer but the shape of the current impulse would then be more difficult to adjust to find a good balance between a sufficient reduction of current so that the temperature of the junction drops sufficiently and a sufficient flow of current to be able to polarise the magnetisation of the storage layer during its cooling.

The interest of the additional polarising layer 90 is to make it possible to cumulate the current of electrons with polarised spin coming from the other layer 82 of the tunnel junction and the current of electrons with polarised spin coming from the polarising layer 90.

This structure of the storage element is particularly simple since it only requires, in addition to the addressing transistor and the tunnel junction, one level of conductive line.

In a second embodiment of the invention, the magnetisations of the two layers F1 and F2 are parallel to the plane of the layers or, more precisely, to the interfaces of said layers.

As previously, the magnetic materials making up the magnetic tunnel junction must be chosen in such a way that one has a faster thermal decrease of its coercive field than the other.

The material of the reference layer F2 may be an alloy based on Co, Fe, Ni (for example [CO]$Co_{90}Fe_{10}$) and its magnetisation may be pinned by an exchange interaction with an antiferromagnetic material with high blocking temperature (a lot higher than 200° C.) such as PtMn.

The material of layer F1 may be formed of art alloy in which the Curie temperature is reduced in volume to enable the switch over of its magnetisation to be facilitated when said material is heated to around 200° C.

An advantageous means of obtaining this property consists in coupling the magmetisation of the storage layer to an antiferromagnetic layer with low blocking temperature (for example $Fe_{50}Mn_{50}$ or $Ir_{20}Mn_{80}$ in which the blocking temperature is below 200° C. where as the magnetisation of the other magnetic layer (the reference layer) is coupled to an antiferromagnetic layer with high blocking temperature, for example PtMn in which the blocking temperature is greater than 280° C.

This is schematically illustrated in FIG. 9, which shows an example of tunnel junction with planar magnetisation that may be used in the present invention.

The reference layer 94 in $Co_{90}Fe_{10}$ is pinned by interaction with an antiferromagnetic layer 96 with high blocking temperature (well above 200° C.), for example in PtMn or NiMn.

The storage layer 98 in $Ni_{80}Fe_{20}$ is coupled to an antiferromagnetic layer 100 with low blocking temperature (between 100° C. and 200° C.), for example in $Fe_{50}Mn_{50}$ or in $Ir_{20}Mn_{80}$ and said layer 98 is separated from the layer 94 by a tunnel barrier layer 102 in $Al_2O_3$.

It should be noted that one way of lowering the blocking temperature of the antiferromagnetic layer coupled to the storage layer may be to reduce its thickness. Indeed, it is known that the thinner an antiferromagnetic layer, the lower its blocking temperature.

The writing of the information is carried out as previously by sending a current impulse through the junction, which has the effect of heating the material of the storage layer (comprising the adjacent antiferromagnetic layer) to a temperature enabling the reversal of the magnetisation of said layer, whereas the reference layer remains at a sufficiently low temperature for its magnetisation to remain fixed.

Figure 10:
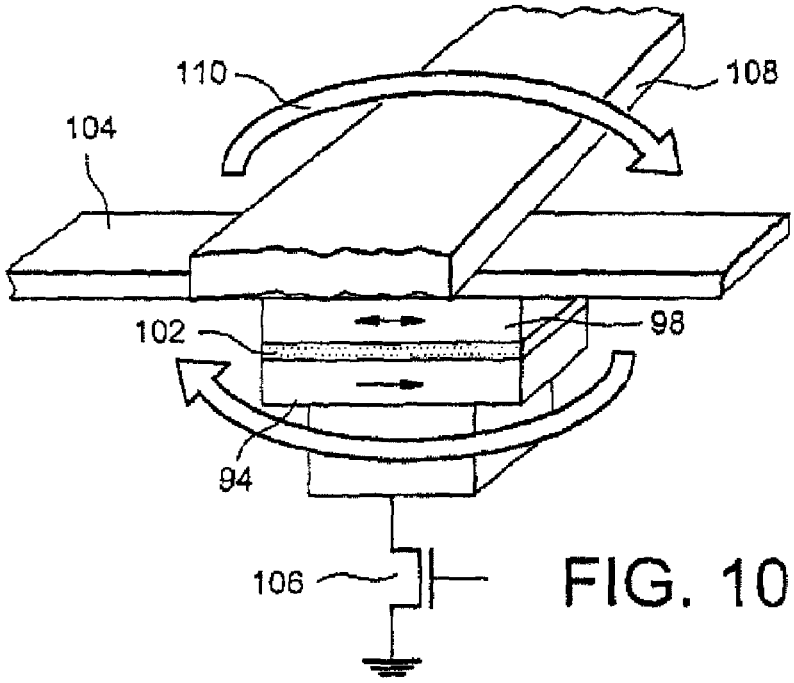
FIG. 10 is a schematic view of an example of magnetic device according to the invention, using a tunnel junction with planar magnetisation.

This is schematically illustrated in FIG. 10, which shows an example of forming a storage element from a tunnel junction with planar magnetisation according to the present invention.

For the writing, the junction is heated above the blocking temperature of the storage layer 98 but below the blocking temperature of the reference layer 94, by sending a current impulse through the junction, said impulse going along the conductive line 104 to the transistor 106, which is then made passing.

The upper conductive line 108 serves to create the magnetic field 110, which polarises the magnetisation of the storage layer 98 in the desired direction during its cooling. Said magnetisation of the storage layer can only take here two states (binary storage).

For the reasons already given above with regard to other examples, the line 108 is not obligatory: its function may advantageously be performed by the line 104. In this case, one also has to verify that the magnetisation directions of the layers are orthogonal to the direction of the line 104.

This device, in which the storage layer is coupled to an antiferromagnetic layer in which the blocking temperature is lower than the reference layer, has two major advantages.

1) The superparamagnetic stability limit of the storage layer is pushed back in such a way that one can form storage elements of smaller size using this technique.

Indeed, a problem that always appears in the storage of magnetic information in storage elements of small size (submicronic scale) is that of the magnetisation stability vis-à-vis thermal fluctuations (superparamagnetic limit).

If K designates the magnetic anisotropy of the material and V the volume of the magnetic storage layer, the characteristic magnetisation reversal time by going above the energy barrier of height KV is $\tau=\tau_0\exp(KV/(kT))$ where $\tau_0$ is a characteristic test time of around $10^{-9}$ seconds, k the Boltzmann constant and T the temperature.

In order for the information that one writes in the storage layer to remain stable for at least 10 years, the magnetisation itself must remain stable for this period. Consequently, it is necessary for $KV/kT>\text{Log}(10\text{ years}/10^{-9}\text{ s})$, in other words: $KV>40\ kT$.

This imposes a minimum limit to the volume of the storage layer and thus its lateral dimension, in other words a minimum limit to the dimension of the storage element.

On the other hand, if the magnetic storage layer is coupled to an antiferromagnetic layer in which the anisotropy is relatively high at ambient temperature but decreases rapidly when one approaches the blocking temperature of said layer (around 200° C.), then the superparamagnetic limit is pushed back.

Indeed, the energy barrier to overcome to reverse the magnetisation of the storage layer at ambient temperature is now equal to $A(K_fE_f+K_aE_a)$ where A designates the common area of the magnetic storage layer and the antiferromagnetic layer, $E_f$ and $E_a$ respectively designate the thicknesses of said storage and antiferromagnetic layers and $K_f$ and $K_a$ respectively designate their magnetic anisotropies. aP Since the anisotropy $K_a$ of the antiferromagnetic material is normally a lot [lower] *higher* than that ($K_f$) of the ferromagnetic layer at ambient temperature, it appears that the condition of stability $A(K_fE_f+K_aE_a)>40$ kT could be satisfied for much smaller dimensions than if the magnetic storage layer was alone.

Typically, the term $K_aE_a$ may be 100 times higher at ambient temperature than the term $K_fE_f$. This implies that the area of the junction may be 100 times smaller while at the same time remaining above the superparamagnetic limit. Consequently, this makes it possible to attain much [high] *higher* integration densities.

It should be pointed out that it is also possible to use this coupling of the storage layer to an antiferromagnetic layer at low Neel temperature in the case previously described of magnetic layers with magnetisation perpendicular to the plane. Here again, the superparamagnetic limit will be pushed back towards the smallest dimensions at ambient temperature.

2) The second very important advantage resulting from the use of a storage layer coupled to an antiferromagnetic layer is to be able to achieve a multilevel storage of the information.

Indeed, with the junctions of the prior art, a storage element has two possible states that correspond to the two magnetic configurations parallel and antiparallel, said configurations corresponding respectively to parallel and antiparallel alignments of the magnetisation of the storage layer in relation to that of the reference layer.

These bistable type systems are obtained by giving to the storage layer a magnetic anisotropy of magnetocrystalline or shape (storage element, for example, of elliptic shape) origin, with an easy magnetisation axis parallel to the magnetisation of the reference layer.

In the present invention, the magnetisation of the storage layer may advantageously be orientated in any intermediate direction between the direction parallel and the direction antiparallel to the magnetisation of the reference layer.

To achieve this, it is sufficient to heat the storage layer and the adjacent antiferromagnetic layer above the blocking temperature of said layer, by sending a current impulse through the junction, then orientating the magnetisation of the storage layer in the desired direction during the cooling of the antiferromagnetic layer.

In order to give the desired orientation to the magnetisation of the storage layer, it is necessary to apply a local magnetic field to said layer in the desired direction. To achieve this, two possibilities exist:

1) One may use an architecture in which the magnetic switching is achieved by sending current impulses in the perpendicular conductive lines, which are respectively situated above and below said storage element.

Said lines make it possible to generate magnetic fields along two perpendicular directions. By playing on the relative intensity of the current flowing in the two lines, one can generate a magnetic field in any direction [to] *in* the plane *of the storage layer*.

Figure 11:
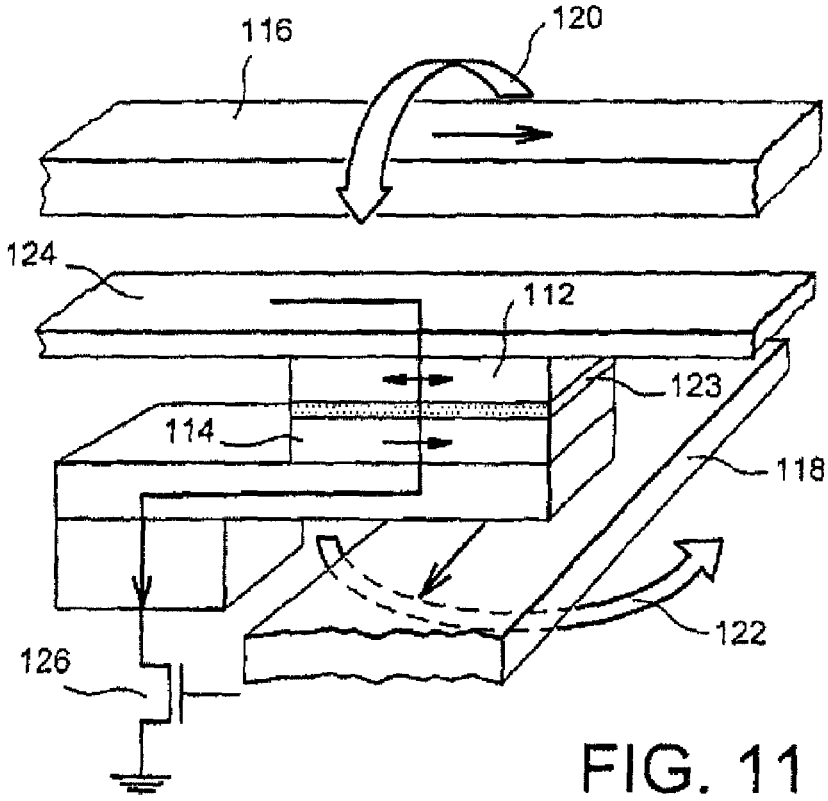
FIG. 11 is a schematic view of another example of said device.

This is illustrated schematically in FIG. 11, which shows an example of forming a storage element from a tunnel junction with planar magnetisation according to the present invention.

For the writing, the magnetic tunnel junction is heated above the blocking temperature of the storage layer 112 but below the blocking temperature of the reference layer 114, by sending a current impulse through the junction.

The upper 116 and lower 118 conductive lines serve to create magnetic fields 120 and 122 along two perpendicular directions in the plane, which makes it possible to polarise the magnetisation of the storage layer 112 in any desired direction in the plane of the junction, during its cooling.

As we have already explained above with regard to FIG. 10, the line 116 is not indispensable: it may be replaced by the line 124.

The magnetisation of the storage layer may therefore take here more than two states (multilevel storage).

In FIG. 11, the reference 123 designates the tunnel barrier layer. Also shown are the conductive line 124 and the switching transistor 126 between which the junction is placed and which makes it possible to make a current flow through said junction when the transistor operates in saturated mode.

2) One can also use the combination of a magnetic field created as previously, by making a current flow in a conductive line situated above or below the tunnel junction, with the magnetic torque exerted by the injection of a current of electrons with polarised spin through the tunnel junction, in the magnetic storage layer.

In this case, the magnetisation of the magnetic layer creating the polarisation of the spin of the electrons injected must be substantially perpendicular to the magnetic field generated by the current flowing in the conductive line.

It is also important in this case to ensure that the current density necessary for orientating the storage layer in the desired direction is substantially lower than that which is necessary for the heating of the junction in such a way that the junction is indeed in a cooling phase below the blocking temperature of the antiferromagnetic layer coupled to the storage layer during the writing process.

The writing is carried out by measuring the level of resistance of the junction.

Indeed, the resistance varies according to the law $$R=R_{par}[1+(\Delta R/R_{par})(1-\cos(\theta_s-\theta_p))/2]$$

where $\theta_s$ and $\theta_p$ respectively represent the angles marking respectively the magnetisations of the storage layer and the pinned layer, or reference layer, in the plane of the junction.

$\Delta R/R_{par}=(R_{ant}-R_{par})/R_{par}$ is the total magnetoresistance amplitude.

The reading of the level of intermediate resistance between the parallel resistance $R_{par}$ and the antiparallel resistance $R_{ant}$ therefore makes it possible to determine the direction of the magnetisation of the storage layer.

In the structures described previously, it is possible to insert thin layers of another material at the interface between the magnetic layer and the tunnel barrier layer.

Said thin layers may be magnetic layers, intended to reinforce the polarisation of the electrons in the neighbourhood of the interface with the tunnel barrier layer, or non magnetic layers making it possible to form quantum wells depending on the spin in the neighbourhood of the tunnel barrier layer or to increase the magnetic decoupling of two magnetic layers on either side of the tunnel junction.

What is claimed is:

1. [Magnetic] *A magnetic* device comprising a magnetic tunnel junction that comprises:

a first magnetic layer [forming] *defining* a reference layer and having a [magnetisation] *magnetization* of fixed direction, a second magnetic layer [forming] *defining* a storage layer and having a [magnetisation] *magnetization* of variable direction, and a third layer *defining a tunnel barrier* that [is semiconductive or electrically insulating and which] separate's the first layer from the second layer, wherein the *first and second magnetic layers have respective blocking temperatures and wherein the* blocking temperature [of the magnetisation] of the storage layer is lower than the blocking temperature [of the magnetisation] of the reference layer and [in that], *wherein* the device further comprises:

means for [heating the storage layer to a temperature higher than the blocking temperature of the magnetisation of said storage layer, said means for heating the storage layer being means provided to make] *generating* an electric current flow through the magnetic tunnel junction, *wherein the storage layer is heated to a temperature higher than the blocking temperature of the storage layer,* and means for applying, to [said] *the* storage layer, a magnetic field capable of orientating the [magnetisation] *magnetization* of [said] *the* storage layer with respect to the [magnetisation] *magnetization* of the reference layer, without modifying the orientation of [said] *the magnetization of the* reference layer.

2. [Device] *The device* according to claim 1, [in which] *wherein* the blocking temperatures of the storage and reference layers have values greater than the value of the operating temperature of the device [outside of heating of the tunnel junction].

3. [Device] *The device* according to claim 1, [in which] *wherein* the [magnetisation] *magnetization* of each of the storage and reference layers is substantially perpendicular to the plane of [said] *the storage and reference* layers.

4. [Device] *The device* according to claim 3, [in which] *wherein* the storage layer [is] *comprises* a Co—Pt or Co—Pd alloy mono-layer or a multi-layer formed by a stack of layers of Co alternating with layers of Pt or Pd [in], such [a way] that the *resulting* coercive field of the storage layer rapidly decreases [when] *with increasing* the temperature [increases].

5. [Device] *The device* according to claim 3, [in which] *wherein* the storage layer [is] *comprises* a mono-layer [in] *of a* cobalt rich alloy with iron or nickel or chromium and platinum or palladium, or a multi-layer formed by a stack of cobalt rich layers with iron or nickel or chromium, alternating with layers of Pt or Pd [in such a way that], *such that* the *resulting* coercive field of the storage layer rapidly decreases [when the] *with increasing* temperature [increases].

6. [Device] *The device* according to claim 1, [in which] *wherein* the [magnetisation] *magnetization* of each of the storage and reference layers is substantially parallel to the plane of [said] *the storage and reference* layers.

7. [Device] *The device* according to claim 1, further comprising a [first] *an* antiferromagnetic layer [combined] *magnetically coupled* with the reference layer, *wherein the antiferromagnetic layer comprises PtMn alloy or a PtPdMn alloy*.

8. [Device] *The device* according to claim 7, [in which] *wherein* the blocking temperature [of the magnetisation] of [said first] *the* antiferromagnetic layer is higher than the blocking temperature of the storage layer.

9. [Device] *The device* according to claim 1, [in which] *wherein* the reference layer is a multi-layer comprising two magnetic layers and an intermediate layer [in] *of* Ru or Re or Ir or Rh, *wherein* the two magnetic layers [being] *are* separated by the intermediate layer and coupled in an antiparallel [maimer] *manner* by interaction through [said] *the* intermediate layer.

10. [Device] *The device* according to claim 1[,] further comprising [a second anti ferromagnetic] *an antiferromagnetic* layer coupled to the storage layer by exchange anisotropy.

11. [Device] *The device* according to claim 10, [in which] *wherein* the blocking temperature of the [magnetisation of said second] antiferromagnetic layer is lower than the blocking temperature of the reference layer.

12. [Device] *The device* according to claim 1, [in which] *wherein* the means for applying a magnetic field to the storage layer comprise means of injecting, in said storage layer, a current of electrons in which the spin is [polarised] *polarized*.

13. [Memory] *A memory* comprising a matrix of storage elements that are addressable by addressing lines and columns, wherein each storage element comprises: a magnetic device according to claim 1, and *wherein the means for generating an electric current comprises* a [means of] current switching [placed] *circuit* in series with [said] *each* magnetic device, *wherein* each magnetic device [being] *is* linked to an addressing line and each [means of] *current* switching [being] *circuit is* linked to an addressing column.

14. [Method] *A method* for writing information in a magnetic device according to claim 1[, in which: one heats] *comprising heating* the storage layer to a temperature higher than the blocking temperature of the [magnetisation] of [said] *the* storage layer, and during the cooling of the storage layer, [one applies] *applying* to [said] *the* storage layer a magnetic field capable of orientating the [magnetisation] *magnetization* of [said] *the* storage layer with respect to the [magnetisation] *magnetization* of the reference layer, without modifying the orientation of [said] *the magnetization of the* reference layer.

15. [Method] *The method* according to claim 14, [in which] *wherein* the [value, seen by] *magnetic field strength applied at* the reference layer[, of the magnetic field applied] during [the storage,] *writing* is less than [the value that] the magnetic field *strength necessary* for reversing the [magnetisation] *magnetization* of the reference layer [takes] at the maximum temperature attained by [said] *the reference* layer during the heating of the junction.

16. [Method] *The method* according to claim 14, [in which] *wherein* the storage layer is coupled to an antiferromagnetic layer by exchange anisotropy and [one heats] the storage layer and [said] *the* antiferromagnetic layer *are heated* to a temperature higher than the blocking temperatures of the [magnetisation of said] *the storage and antiferromagnetic* layers and, during the cooling of the antiferromagnetic layer, [one orientates] the [magnetisation] *magnetization* of the storage layer *is oriented* in any direction [whatsoever] predefined by the direction [of magnetisation] of the magnetic field applied during the cooling.

17. [Method] *A method* for reading information [memorised] *memorized* in the magnetic device according to claim 1, [in which one determines] *wherein* the resistance value of the magnetic tunnel junction *is determined*, and [one deduces] the orientation of the magnetisation of the storage layer *is ascertained* from [said] *the* resistance value.

*18. The device according to claim 1, wherein the storage layer comprises a single layer or multilayer structure and wherein the reference layer is in contact with an antiferromagnetic layer.*

*19. The device according to claim 1, wherein the reference layer comprises a single layer or a multilayer structure, and wherein the storage layer is in contact with an antiferromagnetic layer.*

*20. The device according to claim 3, wherein the storage layer comprises a Co/Ni or a Cu/Ni or a multilayer comprising a stack of cobalt or copper layers alternating with layers of nickel, such that a resulting coercive field of the storage layer rapidly decreases with increasing temperature, and wherein the reference layer comprises a layer of FePt or FePd alloy.*

*21. The method according to claim 15 further comprising injecting spin-polarized electrons into the storage layer during writing that apply a magnetic torque to the magnetization of the storage layer, wherein the magnetic torque applied at the reference layer is less than the magnetic torque for reversing the magnetization of the reference layer at the maximum temperature attained by the reference layer during the heating of the junction.*

*22. A magnetic device comprising:*

*a magnetic tunnel junction including a first magnetic layer defining a reference layer having a blocking temperature and a magnetization in a fixed direction, a second magnetic layer defining a storage layer having a blocking temperature and having a magnetization of variable direction, and a third layer defining a tunnel barrier layer intermediate to the first layer and the second layer, wherein the blocking temperature of the storage layer is lower than the blocking temperature of the reference layer; and*

*circuitry configured to inject a current of spin polarized electrons into the storage layer, such that the tunnel junction is heated and a magnetic torque is applied to the storage layer which orients the magnetization of the storage layer with respect to the magnetization of the reference layer, without modifying the orientation of the magnetization of the reference layer.*

*23. The device according to claim 22, wherein the storage layer, the reference layer, and a layer portion of the circuitry comprise layers having out-of-the-plane magnetization or in-the-plane magnetization.*

*24. The device according to claim 22, wherein the device comprises a storage element of a memory comprising a matrix of storage elements that are addressable by addressing lines and columns, wherein each storage element comprises a current switching circuit placed in series with each device, wherein each device is linked to one of an addressing line or addressing column, and each current switching circuit is linked to the other of the addressing line or addressing column.*

*25. The device according to claim 22 further comprising: a spin-polarizing layer on an opposite side of the storage layer from the reference layer; and a non-magnetic metallic layer intermediate to the spin polarizing layer and the storage layer, wherein the reference layer and the spin polarizing layer comprise oppositely magnetized layers.*

*26. The device according to claim 22 further comprising a conductive line above or below the magnetic tunnel junction and configured to, generate a magnetic field at the storage layer that orients the magnetization of the storage layer with respect to the magnetization of the reference layer, without modifying the magnetization of the reference layer.*

*27. The device according to claim 26, wherein the magnetic field, generated by the conductive line is substantially perpendicular to the direction of polarization of the spin polarized electrons injected in the storage layer.*

*28. A method for writing information in a magnetic device according to claim 22, comprising injecting a current impulse of spin polarized electrons through the magnetic tunnel junction during a heating phase, and in a cooling phase, applying a magnetic torque to the magnetization of the storage layer that is capable of orientating the magnetization of the storage layer with respect to the magnetization of the reference layer, without modifying the orientation of the reference layer.*

*29. The method according to claim 28, in which the magnetic torque applied to the magnetization of the reference layer during writing is less than the magnetic torque necessary for reversing the magnetization of the reference layer at the maximum temperature attained by the reference layer during the heating phase.*

*30. The method according to claim 28, in which the storage layer is coupled to an antiferromagnetic layer by exchange anisotropy and the storage layer and the antiferromagnetic layer are heated to a temperature higher than blocking temperatures of the storage and antiferromagnetic layers and, during the cooling phase, the magnetization of the storage layer is oriented in a direction corresponding to the direction of magnetization induced by the magnetic torque.*

*31. The method of claim 28 further comprising applying a magnetic field to the storage layer during the cooling phase to orient the magnetization of the storage layer with respect to the magnetization of the reference layer.*

*32. A memory cell comprising:*

*a tunnel junction that includes a storage layer adjacent and in contact with an antiferromagnetic layer; and*

*a reference layer separated from the storage layer by a tunnel barrier layer.*

*33. The memory cell of claim 32 further comprising circuitry configured to inject a current of spin-polarized electrons into the storage layer, wherein the spin-polarized electrons heats the storage layer and the antiferromagnetic layer to a temperature higher than blocking temperatures of the storage and antiferromagnetic layers and apply a magnetic torque to set a magnetic orientation of the storage layer with respect to a magnetic orientation of the reference layer, without modifying the magnetic orientation of the reference layer.*

*34. The memory cell of claim 32 further comprising circuitry configured to generate a magnetic field at the storage layer that orients the magnetization of the storage layer with respect to the magnetization of the reference layer, without modifying the magnetization of the reference layer.*

*35. A method for writing to a magnetic device comprising:*

*providing a magnetic tunnel junction including a first magnetic layer forming a reference layer and having a magnetization of set direction, a second magnetic layer forming a storage layer and having a magnetization of variable direction, and a third layer defining a tunnel barrier that separates the first and second layers, wherein the storage layer and reference layer have respective blocking temperatures, and the blocking temperature of the storage layer is lower than the blocking temperature of the reference layer;*

*flowing electric current through the magnetic tunnel junction and heating the storage layer to a temperature higher than the blocking temperature of the storage layer; and*

*applying a magnetic field to the storage layer to orient the magnetization of the storage layer with respect to the*

*magnetization of the reference layer, without modifying the orientation of the reference layer.*

*36. The method of claim 35 further comprising reading information stored in the storage layer by determining a resistance value of the magnetic tunnel junction, and ascertaining the orientation of the magnetization of the storage layer from the resistance value.*

*37. The method of claim 35, wherein flowing electric current comprises injection a current impulse of spin polarized electrons through the magnetic tunnel junction to apply a magnetic torque to the magnetization of the storage layer capable of orientating the magnetization of the storage layer with respect to the magnetization of the reference layer without modifying the magnetization of the reference layer.*

*38. A method for writing to a magnetic device comprising:*

*providing a magnetic tunnel junction including a first magnetic layer defining a reference layer having a blocking temperature and having a magnetization of set direction, a second magnetic layer defining a storage layer having a blocking temperature and having a magnetization of variable direction, and a third layer defining a tunnel barrier intermediate to the first layer and the second layer, wherein the storage layer and the reference layer have respective blocking temperatures, and the blocking temperature of the storage layer is lower than the blocking temperature of the reference layer;*

*injecting a current impulse of spin polarized electrons through the magnetic tunnel junction during a first phase to heat the storage layer above the blocking temperature of the storage layer, and in a second phase, reducing the current through the tunnel junction to allow the storage layer to cool below the blocking temperature of the storage layer, wherein a magnetic torque of the spin polarized electrons is applied to the storage layer that orients the magnetization of the storage layer with respect to the magnetization of the reference layer, without modifying the orientation of the reference layer.*

*39. The method of claim 38, wherein the storage layer is coupled to an antiferromagnetic layer by exchange anisotropy and the storage layer and the antiferromagnetic layer are heated to a temperature higher than blocking temperatures of the storage and antiferromagnetic layers and, during the cooling of the antiferromagnetic layer, the magnetization of the storage layer is oriented in a direction corresponding to the direction of magnetization induced by the magnetic torque.*

*40. The method according to claim 38, further comprising applying a magnetic field to the storage layer, such that the magnetization of the storage layer is oriented with respect to the magnetization of the reference layer, without modifying the orientation of the reference layer.*

* * * * *

UNITED STATES PATENT AND TRADEMARK OFFICE

CERTIFICATE OF CORRECTION

PATENT NO. : RE42,619 E
APPLICATION NO. : 11/861974
DATED : August 16, 2011
INVENTOR(S) : Bernard Dieny et al.

It is certified that error appears in the above-identified patent and that said Letters Patent is hereby corrected as shown below:

In the Claims

In column 15, claim 1, line 11, after "insulating and which]", replace "separate's" with --separates--.

In column 15, claim 7, line 62, before "[first] *an* antiferromagnetic" delete "a".

In column 15, claim 8, line 67, before "blocking temperature", replace "the" with --*the*--.

In column 16, claim 15, line 44, after *"wherein* the", replace [value, seen by] with --value seen by]--.

In column 16, claim 16, line 55, after "blocking temperatures of", delete "the".

In column 16, claim 17, line 66, after "orientation of the", replace "magnetisation" with --magnetization--.

Signed and Sealed this
Twenty-second Day of November, 2011

David J. Kappos

David J. Kappos
*Director of the United States Patent and Trademark Office*